US005663078A

United States Patent [19]
McCarthy

[11] Patent Number: 5,663,078
[45] Date of Patent: Sep. 2, 1997

[54] METHOD FOR FABRICATING TRANSISTORS USING CRYSTALLINE SILICON DEVICES ON GLASS

[75] Inventor: Anthony M. McCarthy, Menlo Park, Calif.

[73] Assignee: Regents of the University of California, Oakland, Calif.

[21] Appl. No.: 373,716

[22] Filed: Jan. 17, 1995

Related U.S. Application Data

[62] Division of Ser. No. 137,402, Oct. 18, 1993, Pat. No. 5,414,276.
[51] Int. Cl.[6] ........................................ H01L 21/786
[52] U.S. Cl. ................ 438/157; 438/158; 438/164; 438/404; 438/970; 438/311
[58] Field of Search ........................... 437/21, 62, 86, 437/974; 148/DIG. 12

[56] References Cited

U.S. PATENT DOCUMENTS

| 5,013,681 | 5/1991 | Godbey et al. | 437/86 |
| 5,110,748 | 5/1992 | Sarma | 148/DIG. 12 |
| 5,436,173 | 7/1995 | Houston | 437/21 |
| 5,455,202 | 10/1995 | Malloy et al. | 148/DIG. 12 |

*Primary Examiner*—Chandra Chaudhari
*Attorney, Agent, or Firm*—L. E. Carnahan; Henry P. Sartorio

[57] ABSTRACT

A method for fabricating transistors using single-crystal silicon devices on glass. This method overcomes the potential damage that may be caused to the device during high voltage bonding and employs a metal layer which may be incorporated as part of the transistor. This is accomplished such that when the bonding of the silicon wafer or substrate to the glass substrate is performed, the voltage and current pass through areas where transistors will not be fabricated. After removal of the silicon substrate, further metal may be deposited to form electrical contact or add functionality to the devices. By this method both single and gate-all-around devices may be formed.

10 Claims, 4 Drawing Sheets

METHOD FOR FABRICATING TRANSISTORS USING CRYSTALLINE SILICON DEVICES ON GLASS

This is a Division of application Ser. No. 08/137,402 filed Oct. 18, 1993 now U.S. Pat. No. 5,414,276.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to fabricating single-crystal silicon devices, particularly to the fabrication of devices on an insulator substrate, and more particularly to a method for producing transistors in a silicon-on-glass substrate, wherein device components are formed on a silicon substrate, transferred to a glass substrate, and whereafter additional transistors may be formed.

Silicon-on-insulator (SOI) technologies have advanced dramatically in recent years towards the goal of producing thin single-crystal silicon films on insulated substrates. Components such as metal-oxide-semiconductor (MOS) transistors, fabricated in SOI films have the potential for increased mobility, reduced parasitic capacitance and leakage current as well as improved radiation hardness due to reduced junction sidewall area and elimination of bottom junction area. To date, there has been no success in achieving single crystal silicon device fabrication on less expensive glass substrates capable of withstanding temperatures of no more than 600° C. Others have achieved this with expensive glasses, such as Corning 1729 using 800° C. (see L. J. Spangler et al., "A Technology for High-Performance Single-Crystal Silicon-on-Insulator Transistors", IEE Electron Device Letters, Vol. 13, No. 4, April 1987, pp.137–139) and Corning 1733 at 600° C. with compromises (see U.S. Pat. No. 5,110,748 issued May 5, 1992 to K. Sarma). SOI transistors on glass substrates are particularly attractive for sensors and displays, although many other applications are possible such as actuators, high temperature electronics, optoelectronics, and radiation hard electronics.

A wide variety of techniques have been proposed for realizing thin silicon films compatible with high-performance devices on an insulating substrate. Due to the high temperature processing requirements of silicon (greater than 800° C.), silicon-on-glass substrate processing has not been possible except on the so-called "high-temperature" glass, such as Corning 1729 glass, capable of withstanding greater than 800° C. temperatures. Other glasses used in commercial applications, such as lap-top displays, cannot withstand temperature exposures greater than 600° C., such as the Corning 7059 or other "low-temperature" glasses. Due to the high temperatures of silicon processing conventional silicon-on-glass techniques have relied on amorphous (a-Si) and polycrystalline (p-Si) materials which can be doped and treated at temperatures that the glass can withstand, but whose performance is decidedly inferior to single-crystal films. These prior approaches to forming silicon-on-insulator substrates are exemplified by U.S. Pat. No. 5,013,681 issued May 7, 1991 to D. J. Godbey et al. and the following articles: "Nanosecond Thermal Processing For Ultra-High-Speed Device Technology", T. W. Sigmon et al., Materials Research Society Symp. Proc., Vol. 158, 1990, pp. 241–153; "Low-Temperature Fabrication of p+-n Diodes with 300-Å Junction Depth", K. H. Weiner et al., IEEE Electron Device Letters, Vol. 13, No. 7, July 1992, pp. 369–371; and "Monte Carlo Simulation of a 30 nm Dual-Gate MOSFET. How Short Can Si Go?" D. J. Frank et al., IEDM Technical Digest, December 1992, pp. 593–597.

A technique for forming single-crystal silicon on insulator and single-crystal devices is presented in U.S. Pat. No. 5,110,748 issued May 5, 1992 to K. Sarma. This approach suffers from the drawback that the sheet resistance of the implanted layers is high since these layers are annealed at 600° C. The mobility of the ELO (epitaxial layer overgrowth) layer is also less than ideal due to the formation of grain boundaries over the dielectric of interest. Furthermore, the back interface of the silicon underneath the active device area has a cusp which may cause back gate control problems.

Recently, a silicon-on-glass process has been developed using pulsed laser doped silicon layers, as described and claimed in copending application Ser. No. 08/137,401, now U.S. Pat. No. 5,395,481, filed Oct. 18, 1993, entitled "A Method For Forming Silicon On A Glass Substrate". Also, a process has been developed for forming buried components in the silicon-on-glass substrate and for providing electrical contacts for the buried components using pulsed laser energy, as described and claimed in copending application Ser. No. 08/137,412, now U.S. Pat. No. 5,488,012 filed Oct. 18, 1993, entitled "Silicon On Insulator With Active Buried Regions". In addition, a process has been recently developed to provide crystalline silicon devices on glass substrates, as described and claimed in copending application Ser. No. 08/137,411, now U.S. Pat. No. 5,399,231 filed Oct. 18, 1993, entitled "Crystalline Silicon Devices on Glass".

While these recent efforts have resulted in a significant advance in the SOI technologies, there are significant advantages to utilizing the conventional silicon high temperature processing, but there is a need for the capability to produce microelectronic devices on glasses incapable of withstanding temperatures greater than 600° C. These advantages relate to the immediate ability of silicon microelectronics firms to take advantage of this technology without significant capital investment. The present invention satisfies this need by providing a process in which a low-temperature glass substrate may be used in a silicon-on-insulator device. Basically, this is accomplished by first forming the microelectronic device components on a silicon substrate and then transferring them to a glass substrate. Thus, single-crystal silicon films can be utilized, instead of the previously used amorphous and polycrystalline silicon films, in SOI devices on glass.

The use of anodic bonding for sealing the silicon to the glass may cause electrical damage to the components fabricated by this process. It has been discovered that bypassing current through the areas of the silicon-on-glass wafers in which the transistors will not be formed, will eliminate possible damage to the components formed. This is accomplished by the deposition of a metal layer between the formed components and the silicon layer to be bonded to the glass substrate. It is thus seen that the present invention overcomes the problems of the above-referenced approaches to SOI technology, avoids the incompatibility of the silicon and glass processing temperatures, solves the potential problem of causing damage to the electrical components on the silicon, and thus advances the state of this technology.

SUMMARY OF THE INVENTION

It is an object of the present invention to provide a method for fabricating components, such as transistors, using the single-crystal silicon on glass technology.

A further object of the invention is to overcome problems associated with electrical damage to device components during anodic bonding of silicon to glass.

Another object of the invention is to provide a method for forming a gate-all-around device using the single-crystal silicon-on-glass technology.

Another object of the invention is to enable the use of less expensive, lower temperature glass substrates in the manufacture of components, such as transistors, nevertheless using conventional high temperature silicon processing.

Another object of the invention is to provide a technique for manufacturing single-crystal-silicon (SCS) metal-oxide-semiconductors (MOS) transistors and bipolar transistors on glass.

Another object of the invention is to provide a process of fabricating single-crystal-silicon (SCS) devices on glass which require metal on at least one face of the device.

Other objects and advantages of the invention will become apparent from the following description and accompanying drawings. Basically, this invention constitutes an improvement over the device fabrication method described and claimed in above-referenced U.S. application Ser. No. 08/137,411. This invention both overcomes the electrical damage that may be caused to a device during the high voltage bonding of the silicon to the glass substrate, via the provision of a metal layer, which may be incorporated as part of the component. Multilayers are formed on a silicon substrate which may include epitaxial layers of boron doped silicon, (or -lead or -tin) silicon-germanium alloy layers, and silicon, whereafter regions are implanted and thermally activated in the top or device-quality silicon layer. An oxide layer is then thermally grown or deposited, followed by a layer of metal, such as aluminum, and an amorphous layer of silicon, silicon nitride, or silicon dioxide. Patterning of the oxide layer allows the metal layer to physically and electrically contact the silicon. The multilayer structure is anodically bonded to a glass substrate, and due to the metal layer contacting the silicon, the current passes through areas which have not been employed to form device components, thus eliminating problems associated with electrical damage during the bonding operation. Following bonding the silicon substrate and the extra epitaxial layers are removed leaving the device quality top silicon layer with embedded components on the glass. At this point devices are functionally present on the glass and only a few steps such as device isolation, passivation, contact hole formation and an optional final metalization need to be performed. Further refinements of the circuitry on the glass may be performed, using the implanted and activated areas to form, for example, single gate or a gate-all-around device.

BRIEF DESCRIPTION OF THE DRAWINGS

The accompanying drawings, which are incorporated into and form a part of the dislosure, illustrate embodiments of the invention and, together with the description, serve to explain the principles of the invention.

DETAILED DESCRIPTION OF THE INVENTION

The invention is directed to the fabrication of components, such as transistors on glass using single-crystal silicon on glass. The invention overcomes problems relating to transistor damage due to high voltages used in anodic bonding of the silicon to the glass. This is accomplished by use of a patterned oxide layer and a metal layer, whereby the current passes through areas not occupied by the transistor components.

The method of this invention is initially carried out as in the above-referenced copending application Ser. No. 08/137, 411, but with the addition of a patterned oxide layer, and a metal (aluminum or titanium) layer, and an outer dielectric layer prior to bonding to the glass substrate.

Figure 1:
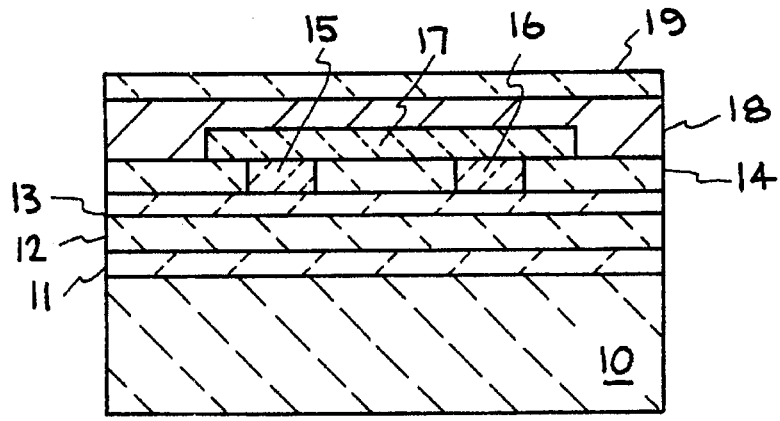
FIG. 1 illustrates an example of multilayers deposited on a silicon substrate.
Figure 2:
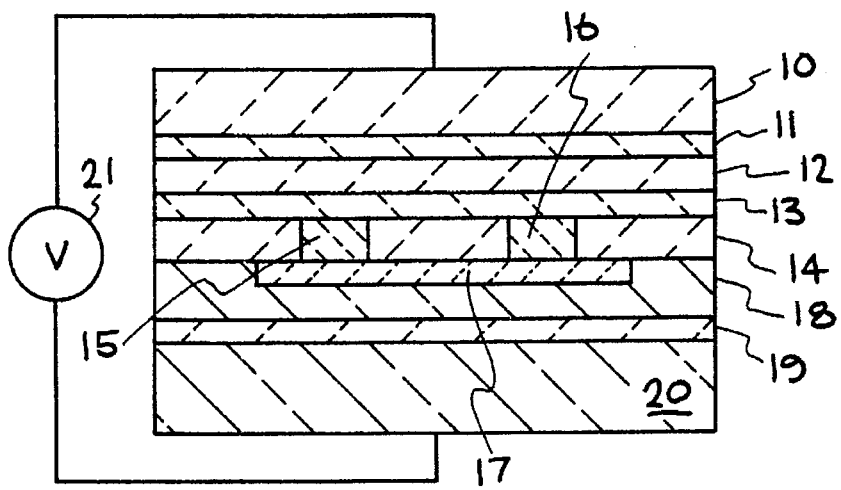
FIG. 2 illustrates an example of deposited silicon substrate bonding of the multi-layer structures of FIG. 1 to a glass substrate.
Figure 3:
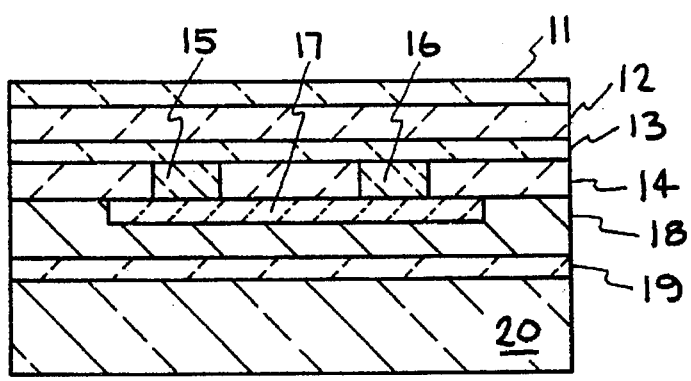
FIGS. 3 and 4 illustrate the process of removing the silicon substrate and the extra epitaxial layers following bonding to the glass substrate.
Figure 4:
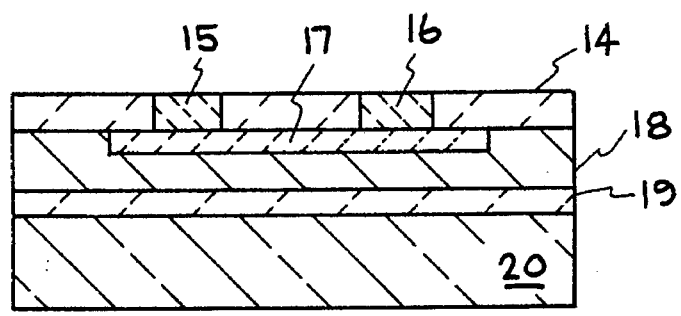
Figure 5:
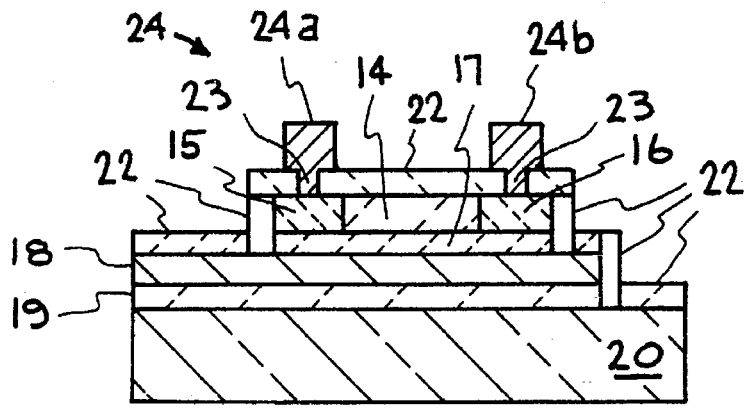
FIG. 5 illustrates an embodiment of a single gate metal-oxide-semiconductor device formed on the glass substrate.
Figure 6:
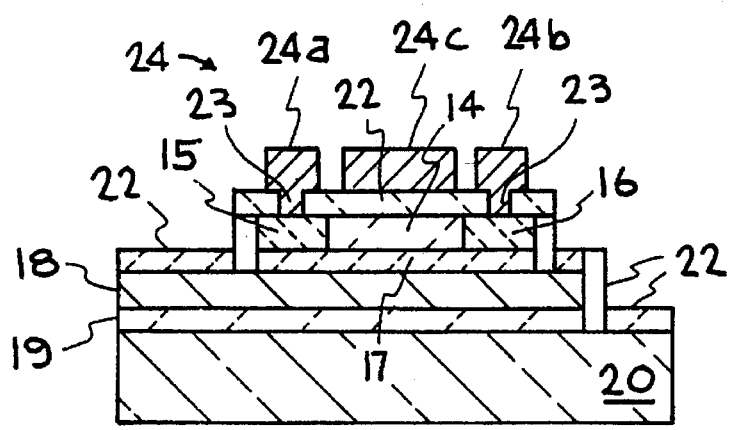
FIG. 6 illustrates an embodiment of a gate-all-around metal-oxide-semiconductor device formed on the glass substrate.

FIGS. 1–4 illustrate the forming of a silicon-on-glass device, with FIGS. 5 and 6 illustrating various components formed on the silicon on glass device of FIG. 4. The method for carrying out the invention is exemplified by the following operational sequence with reference to the drawings:

1. A silicon wafer 10 having a (100) orientation is used as the starting substrate.

2. A first etch stop layer 11 is formed on the silicon wafer 10. Typical means of forming this layer are implantation, epitaxy or liquid source doping in a furnace at temperatures in excess of 750° C. with a boron level exceeding about 1e19 $cm^3$. The thickness of the layer is determined by the selectivity of the etching technique subsequently used to remove the silicon wafer, and may, for example, be 500 μm. In experimental verification, a liquid source doped boron layer, about 3 microns thickness of which exceeded the required doping level, was used. An alternative etch stop approach is to use a layer of SiGe:B (see W. P. Maszara, "Strain compensated Epitaxial Etchstop for BESOI", Proceedings of the 1992 IEEE International SOI Conference, p6).

An intermediate silicon layer 12 is epitaxially grown on the surface of layer 11. In this approach the thickness of layer 12 was 1.5 microns. A suitable thickness of layer 12 exceeds 0.5 microns. In this example the intermediate layer 12 was undoped.

A second etch stop layer 13 may be an epitaxially grown boron doped silicon layer or a silicon-germanium layer. If a boron doped layer 13 is used the thickness required will exceed about 500Å and the doping density will exceed about $5e19/cm^3$. In the event a silicon-germanium (SiGe) epitaxial layer 13 is used, it should have a thickness of about 100–1500Å. Doping may be used in the SiGe layer but is not necessary to achieve adequate etch stop properties. The SiGe layer may have between 1 and 50% Ge. An undoped thickness of about 500Å is usually sufficient. In this example, 10–25% SiGe layers were used. Also, epitaxially grown silicon-lead or silicon-tin may be used in layer 13, and may be boron doped.

3. An epitaxial layer 14 of device quality silicon, thickness of 0.01–1 µm, is epitaxially deposited on the etch stop layer 13 (see FIG. 1).

4. The silicon layer 14 is pattern-implanted with the desired dopant species to form the source/drain regions 15 and 16, and then activated at a temperature over 600° C. (see FIG. 1). A low doping concentration in the range 1e14/cm$^3$–5e16/cm$^3$ layer is suitable for MOS devices. The etch stop material (SiGe) will normally sustain short anneals in the temperature range of 600° C.–800° C. without adverse effects.

5. An oxide layer 17 having a thickness of 0.01–0.5 µm is formed by thermal oxidation or low-temperature deposition on the silicon layer 14. The oxide layer 17 may be composed of silicon dioxide, for example. This layer is patterned and etched to form contact holes for the subsequent metal deposition. This contact between the metal and the silicon outside the device areas permits current flowing during anodic bonding to flow around the devices without damage to the devices themselves. An alternative arrangement is not to have any contacts between the metal and the silicon wafer but to undersize the glass substrate with respect to the silicon wafer so that electrical contact can be made to the metal layer during bonding.

6. A metal layer 18, such as aluminum, having a thickness of 0.01–1 µm, for example, is deposited over the oxide layer 17 and the exposed sections or areas of the silicon layer 14. Other metals, such as titanium, or conductive materials, such as polysilicon, may be used in layer 18.

7. A layer (or sequence of layers) 19 of amorphous material, such as a-Si, a-SiN, a-SiON, or a-SiO, having a thickness of 0.01–1.0 µm, for example, is deposited on the metal layer 18 by plasma enhanced chemical vapor deposition, as set forth in above-referenced copending application Ser. No. 08/137,411.

8. A glass wafer or substrate 20 is selected and cleaned.

9. The silicon wafer 10 is bonded to the clean glass wafer or substrate 20, see FIG. 2, by anodic bonding at a temperature of 300°–700° C. and 0.5–5000 volts, using standard anodic bonding techniques. The power supply is indicated at 21. Due to the oxide layer 17 and the metal layer 18, voltage and current flow around areas 15 and 16, thus eliminating possible damage thereto.

10. The silicon wafer substrate 10 is removed leaving the etch stop layer 11 exposed, as shown in FIG. 3. This can be accomplished by polishing and/or wet/dry etching techniques. Polishing, using a diamond containing slurry, is used to grind down the silicon wafer 10 to a thickness of 100–200 µm followed by a wet or dry etch to complete removal of the silicon wafer. A wet etch of a 3:1 H$_2$O/KOH was used at 80° C., although typical H$_2$O/KOH compositions consist of 1:1–5:1. The time period of wet etching in this example was 8 hours. If desired, for the final 30 µm of the silicon wafer etch, Isopropanol (ISO) may be added to the H$_2$O/KOH solution in excess of solubility and temperature may be reduced to provide a very sensitive etch stop. For example, a solution of 2:6:1 KOH:H$_2$O:ISO at 60° C. may be used. The etch rate of lightly doped silicon in this solution is about 2500Å/minute whereas the etch rate of heavily boron doped silicon and SiGe is about 30Å/minute.

11. The etch stop layer 11 is removed by wet or dry etching, as shown in FIG. 4. In this example, the layer 11 is etched by plasma etching in a SF$_6$/C$_2$ClF$_5$ environment using a power density of about 0.25 Watts/cm$^2$ for about 25 minutes.

The intermediate layer 12 is removed using the same selective etch of 3:1 KOH with Isoproponal added above liquid solubility as mentioned in paragraph 10. If the second etch stop 13 is SiGe is removed with a 5:1:1 H$_2$O:H$_2$O$_2$:NH$_4$OH as described in the above-referenced Godbey et al. patent, and if it is a boron doped silicon layer it is removed with plasma etching optionally followed by laser or by wet silicon etching using for example, 2:1 H$_2$O:NH$_4$OH.

12. Layer 14 is patterned and etched, to form a silicon island between components 15 and 16, shown in FIG. 5. Layers 18 and 19 are patterned and etched, to form light shield regions under the silicon islands as shown in FIG. 5.

A low temperature oxide 22 layer is deposited over the exposed layers, with the layer 22 being composed of silicon dioxide, for example.

13. A metal layer generally indicated at 24, is deposited over this oxide layer 22 after the formation of contact holes 23 in layer 22 to the implanted and activated regions 15 and 16 using conventional microelectronic lithographic technology. The metal layer 24 may be composed of aluminum or other conductive metal or materials. Metal regions 24A and 24B are patterned from the metal layer 24, see FIG. 5, forming the source (24A) and the drain (24B), respectively, of a conventional metal oxide semiconductor (MOSFET) transistor, with the metal layer 18 acting as the gate of this transistor.

14. A gate-all-around MOSFET may be formed from the single-gate MOSFET of FIG. 5, as shown in FIG. 6, by patterning the metal layer 24 to define metal regions 24A, 24B, and 24C, as shown in FIG. 6, to form a second gate 24C thereby providing a gate-all-around embodiment. Metal layers 18 and 24C act as gates, with region 24A acting as the source, and region 24B acting as the drain, of the FIG. 6 gate-all-around transistor. In the gate-all-around embodiment the active interfaces are those between layers 17 and 14 and layers 22 and 14 bounded by the source and drain.

Figure 7:
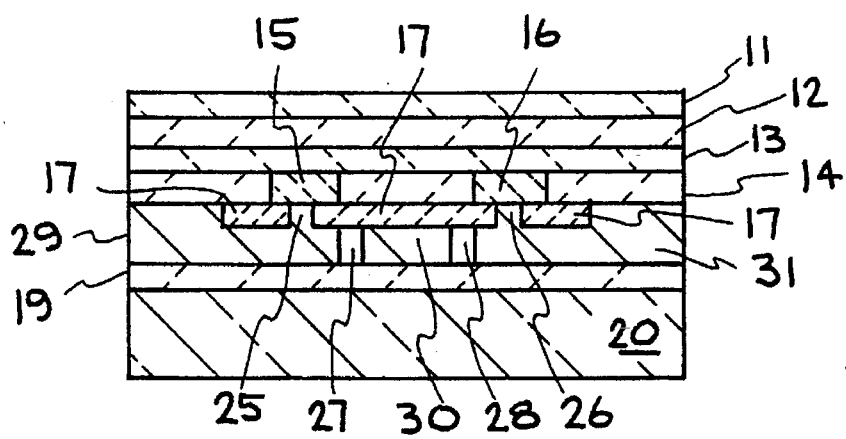
FIGS. 7–10 illustrate the fabrication process of an alternative embodiment of a gate-all-around metal-oxide-semiconductor device formed on the glass substrate.
Figure 8:
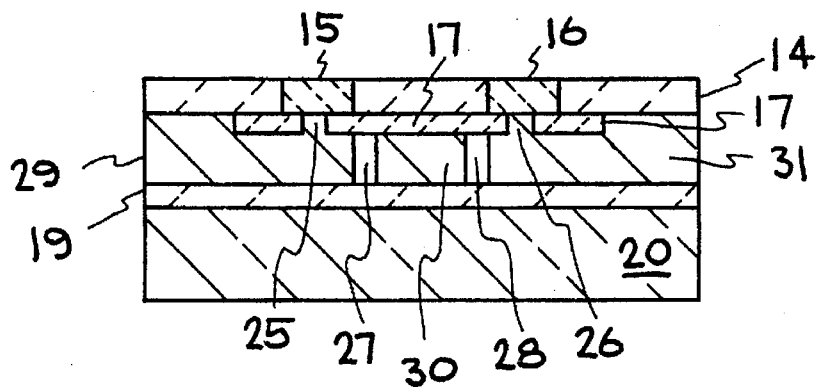
Figure 9:
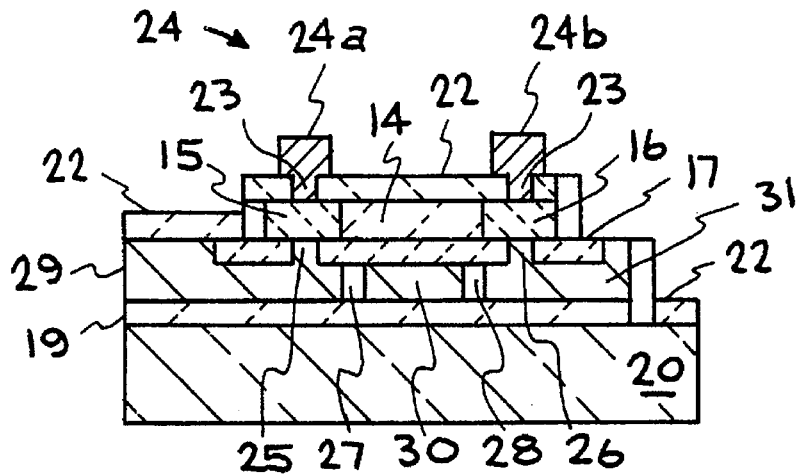
Figure 10:
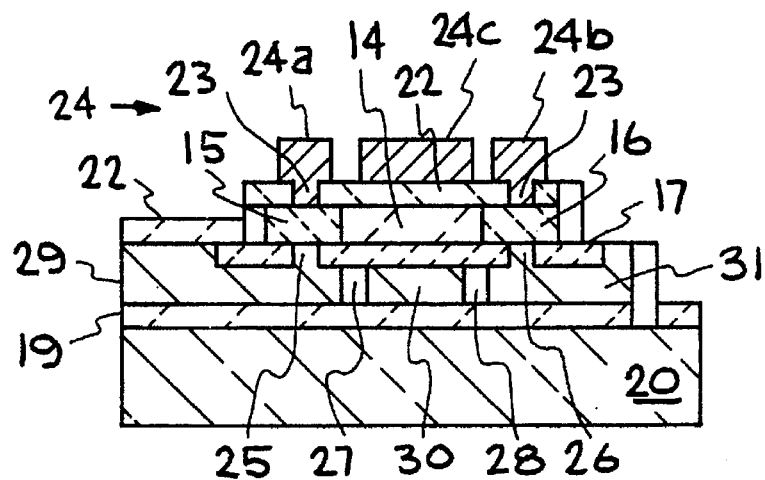

An alternative embodiment of the single gate device has contacts to the source and drain made on the silicon wafer prior to bonding as shown in FIG. 7 where patterned holes made in layer 17 include contacts 25 and 26 to the source and drain regions 15 and 16 on the top of the glass wafer. Layer 17 may be either a thermal oxide or a low temperature oxide, composed of silicon dioxide, for example. In this case, the source drain and gate metalizations must be patterned prior to bonding to allow access to the three terminal device. Spaces 27 and 28 are formed in the patterned metal layer, indicated at 29, 30, and 31 as seen in FIG. 7. The identical process development through FIGS. 3–6 is followed and is reproduced in FIGS. 7–10. FIG. 8 shows a single gate device where the active interface is again that between layers 17 and 14 bounded by the source 15 and drain 16 but in this case contacts 25 and 26 to the source and drain are made under the device as seen from the top in FIG. 8. FIG. 9 shows the device contacted from both the top and the bottom with metal layers 24A and 24B from the top and layers 29, 30, and 31 via contacts 25 and 26 from the bottom. FIG. 10 shows a gate-all-around device implemented in this scheme with gates 24C and 30 and the drain and source contacted on both sides.

Figure 11:
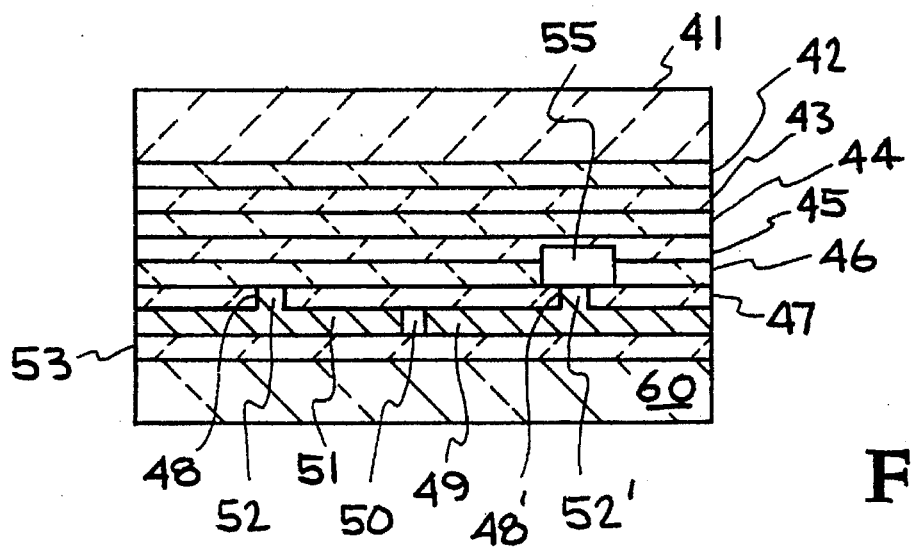
FIGS. 11–12 illustrate an embodiment of a bipolar junction transistor made in accordance with the invention.
Figure 12:
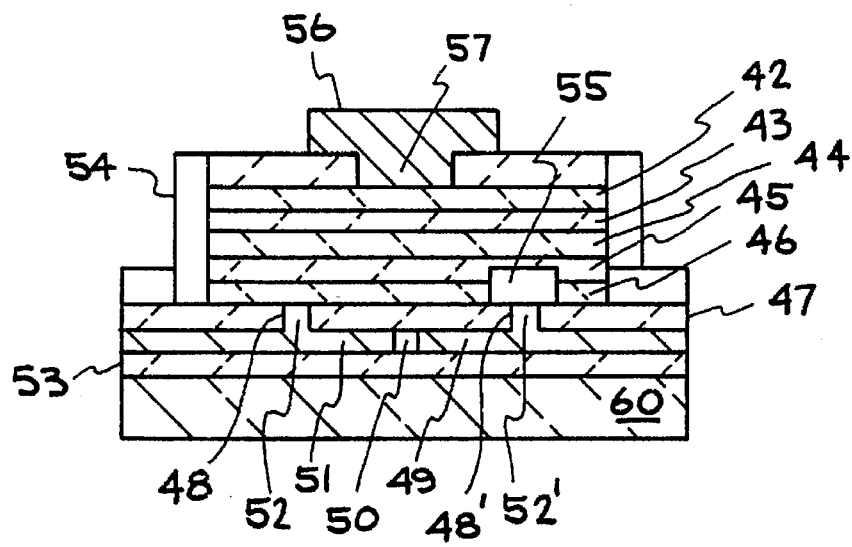

An alternative embodiment of this technology is shown in FIGS. 11–12 where a bipolar transistor is bonded to glass. In this case the silicon wafer 41 is prepared with an initial etch stop layer 42 similar to those described in paragraph 2 above. The subsequent layer deposition to achieve a bipolar configuration is variable but one example is shown here. Layer 43, called the buried collector is a layer of conductivity type 1, usually doped in the range 1e19–1e21/cm$^3$.

Examples of conductivity types are p-type silicon achieved by doping silicon with boron or other Column V elements, and n-type silicon achieved by doping silicon with phosphorus or other Column III elements. Layer 44, called the intrinsic collector has the same conductivity type 1 as layer 43 and its doping range lies approximately in the range 1e15–1e17/cm$^3$. Layer 45, called the base, has conductivity type 2 and its doping range lies approximately in the range 5e17–5e18/cm$^3$. Layer 46, called the emitter, has conductivity type 1 and its doping range lies approximately in the range 5e18–1e21/cm$^3$. Electrical contact to the base 45 is established by a high dose implant of conductivity type 2 shown as 55. Layer 47 is a deposited or thermally grown oxide. Electrical contact to the emitter 46 is established by an opening or contact hole 48 in oxide layer 47 through which a contact 52 of a metal layer 51 deposited over oxide layer 47 extends. Electrical contact to the base 45 is established by opening or contact hole 48' in oxide layer 47 through which a contact 52' of a metal layer 49 extends. Metal layers 51 and 49 are separated by a gap or opening 50 so as to separate the base metal 49 from the emitter metal 51. A dielectric layer 53, of amorphous nitride is deposited over the metal layers 49 and 51 and gap or opening 50. The silicon wafer 41 with the attached layers 42–53 is bonded to a glass substrate 60 via layer 53.

Figure 13:
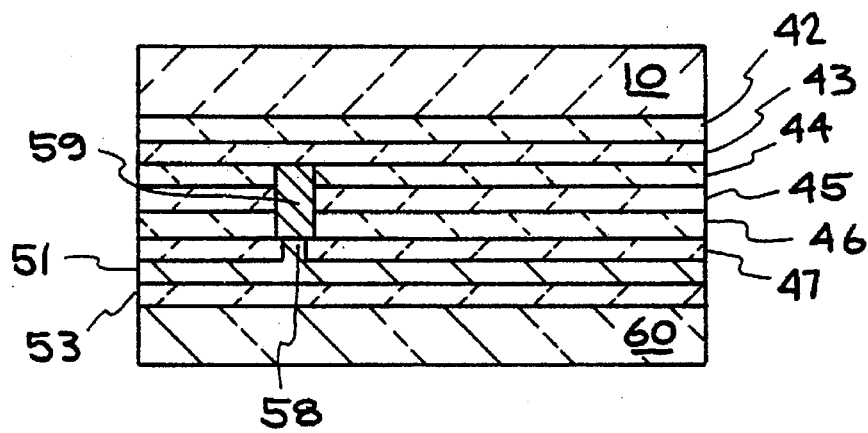
FIG. 13 illustrates an embodiment using a trench arrangement to provide current bypassing during anodic bonding of the silicon to the glass substrate.

To avoid damage to the device junctions during anodic bonding, the metal layers 49 and 51 may be contacted from the front of the wafer by undersizing the glass 60. Alternatively, a third contact hole type may be opened at specific locations as shown in FIG. 13 where a trench 59 may be patterned, creating opening 58, and plasma etched followed by metal deposition to provide contact from the metal layer 51 to the substrate allowing the bypassing of current during anodic bonding.

After bonding the silicon wafer to the glass substrate, the silicon wafer is removed according to the etching schedule described in paragraph 10. The substrate with the remaining thin film of silicon is patterned and etched to remove unwanted areas of silicon and to isolate the transistors. The etching may be performed as in paragraphs 11. After completing isolation, a low temperature oxide layer 54, is deposited over the exposed layers (see FIG. 12). A contact opening 57 may be made on the silicon island in this oxide layer to allow contact with the extrinsic P+/N+ collector from a deposited metal 56, such as aluminum or aluminum/ 1% Si. Openings in the oxide layer 54 may also be made to permit contact to the two other electrodes, the base 49 and the emitter 51.

It has thus been shown that the present invention provides a method for forming microelectronic devices, such as single and gate-all-around transistors, on a silicon-on-glass substrate, thus advancing the state of this art. Also, the method provides for anodic bonding of a layer of silicon to a glass substrate without adverse effects on the implanted and activated regions formed in the silicon layer.

While particular embodiments of microelectronic devices have been illustrated or described, and an example of an operational procedure, including materials, processing techniques, etc., for producing such exemplified devices has been described and illustrated to set forth the principles of the invention, such are not intended to limit the invention. Modifications and changes will become apparent to those skilled in the art, and it is intended that the invention be limited only by the scope of the appended claims.

I claim:

1. A method for fabricating microelectronic devices using crystalline silicon on glass, comprising:

forming at least one etch stop layer on a silicon substrate;

forming at least one layer of silicon on the etch stop layer;

providing the layer of silicon with at least one patterned doped and activated region therein;

forming an oxide layer over at least the doped and activated region;

forming a layer of conductive material over the oxide layer and exposed areas of the silicon layer;

forming an amorphous silicon containing layer over the conductive material layer;

bonding the amorphous silicon layer to a glass substrate;

removing the silicon substrate;

removing the etch stop layer;

forming at least one island in the at least one silicon layer; and patterning the oxide and the conductive material layer.

2. The method of claim 1, additionally including forming an oxide layer on at least one area of the silicon layer, and forming a metal layer on the oxide layer.

3. The method of claim 1, additionally including patterning and etching the layers on the glass substrate to form a desired configuration prior to forming the metal layer on the doped and activated area.

4. The method of claim 1, wherein the etch stop layer is composed of material selected from the group of silicon-germanium, silicon-lead, silicon-tin and boron doped silicon-germanium-lead, and boron doped silicon-germanium-tin; and wherein said layer of conductive material is composed of material selected from the group of aluminum, titanium, and polysilicon.

5. The method of claim 1, wherein the amorphous silicon layer is composed of a material selected from the group consisting of silicon, silicon nitride, silicon dioxide.

6. The method of claim 1, wherein the amorphous silicon layer is a material selected from $\alpha$-Si, $\alpha$-SiN, $\alpha$-SiON, and $\alpha$-SiO.

7. The method of claim 1, wherein the bonding is carried out by anodic bonding at a temperature of 300°–700° C. and voltage of 0.5–5000 volts.

8. The method of claim 1, additionally including forming at least one additional etch stop layer on the first formed layer of silicon, and forming at least one additional layer of silicon on each etch stop layer, whereby there is at least an etch stop layer, a layer of silicon, an etch stop layer, and a layer of silicon, and wherein the last formed layer of silicon is of a device quality type.

9. The method of claim 8, wherein the layer of conductive material is composed of material which includes a metal.

10. The method of claim 8, wherein each of said etch stop layers may be composed of material selected from the group consisting of boron doped silicon, silicon-germanium, silicon-lead, silicon-tin and boron doped silicon-germanium, silicon-lead and silicon-tin.

* * * * *